United States Patent [19]
Koide et al.

[11] Patent Number: 5,389,198
[45] Date of Patent: Feb. 14, 1995

[54] STRUCTURE AND METHOD OF MANUFACTURING THE SAME

[75] Inventors: Akira Koide, Chofu; Kazuo Sato, Tokyo; Seiko Suzuki, Hitachi-Ota; Norio Ichikawa, Mito; Hidehito Obayashi, Tokyo; Masahide Hayashi, Katsuta, all of Japan

[73] Assignees: Hitachi, Ltd.; Hitachi Automotive Engineering Co., Ltd., Japan

[21] Appl. No.: 763,519

[22] Filed: Sep. 23, 1991

[30] Foreign Application Priority Data

Sep. 26, 1990 [JP] Japan ................................. 2-254153
Sep. 26, 1990 [JP] Japan ................................. 2-254154
Jun. 4, 1991 [JP] Japan ................................. 3-132690

[51] Int. Cl.⁶ .......................................... H01L 21/00
[52] U.S. Cl. ................................... 156/651; 156/662; 156/659.1; 156/661.1; 437/225; 437/228
[58] Field of Search ............ 156/657, 662, 651, 659.1, 156/661.1; 437/228, 225

[56] References Cited

U.S. PATENT DOCUMENTS

| | | | |
|---|---|---|---|
| 4,911,783 | 3/1990 | Voboril | 156/662 X |
| 5,116,457 | 5/1992 | Jerman | 156/662 X |
| 5,131,978 | 7/1992 | O'Neil | 156/662 X |

FOREIGN PATENT DOCUMENTS

| | | |
|---|---|---|
| 64-18063 | 1/1989 | Japan . |
| 1-152369 | 6/1989 | Japan . |

*Primary Examiner*—Thi Dang
*Attorney, Agent, or Firm*—Fay, Sharpe, Beall, Fagan, Minnich & McKee

[57] ABSTRACT

A method of manufacturing structures such as a pressure gauge, an accelerometer and the like with a single crystal material such as silicon uses etching techniques where the shape of a part subjected to stress concentration has a curvature, another part is formed in a plane body and a polyhedron is constituted by combining both.

To attain the above constitution, a wafer of single crystal material is formed with a stepped surface having a value corresponding to at least the depth of the curvature in a first anisotropic etching process using a prescribed etching mask, and in a second anisotropic etching process, an etching mask is used by removing at least a part of the etching mask used in the first anisotropic etching process.

20 Claims, 8 Drawing Sheets

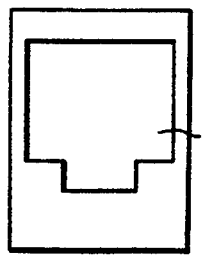 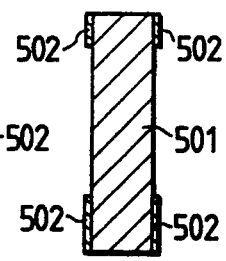 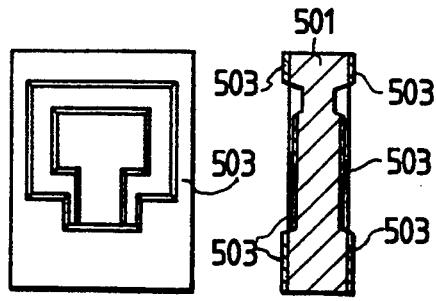
FIG. 5A    FIG. 5A'    FIG. 5D    FIG. 5D'
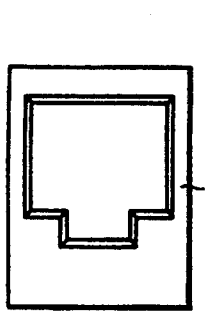 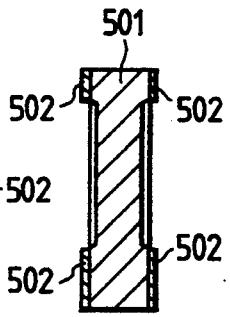 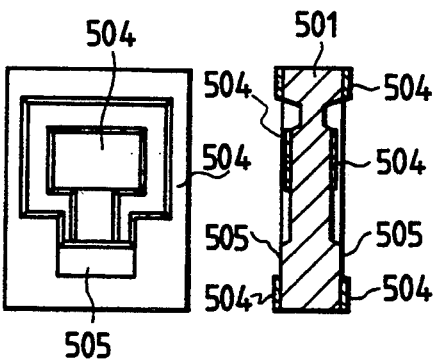
FIG. 5B    FIG. 5B'    FIG. 5E    FIG. 5E'
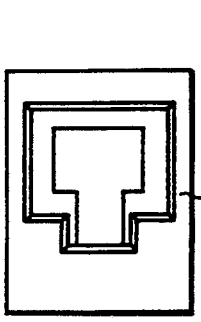 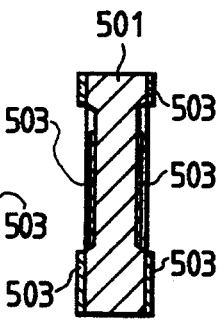 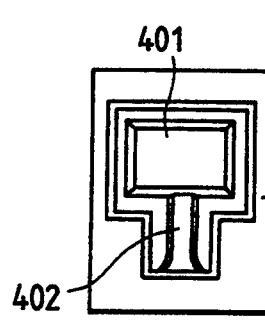 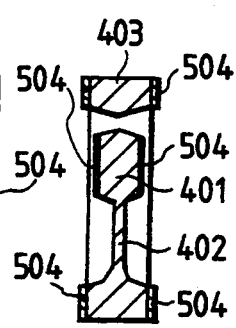
FIG. 5C    FIG. 5C'    FIG. 5F    FIG. 5F'

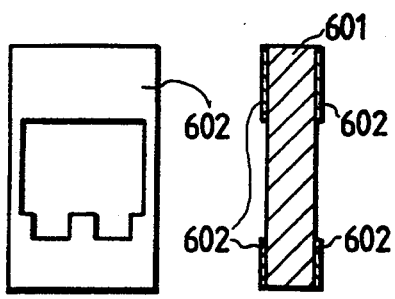 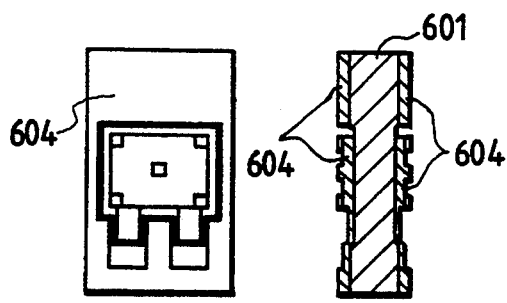
FIG. 6A  FIG. 6A'  FIG. 6E  FIG. 6E'
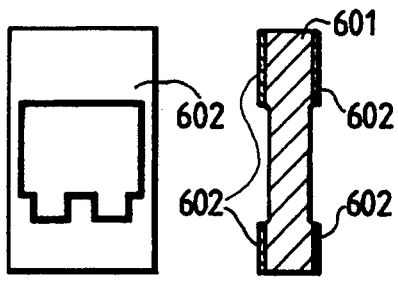 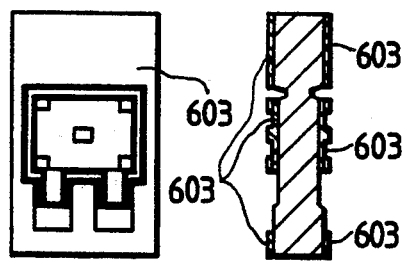
FIG. 6B  FIG. 6B'  FIG. 6F  FIG. 6F'
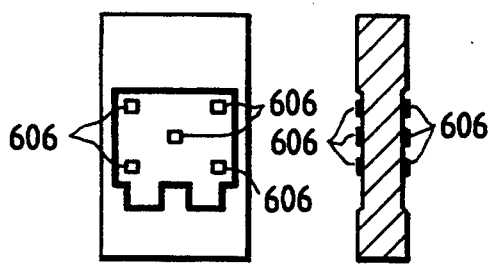 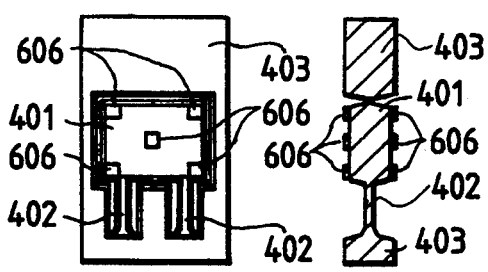
FIG. 6C  FIG. 6C'  FIG. 6G  FIG. 6G'
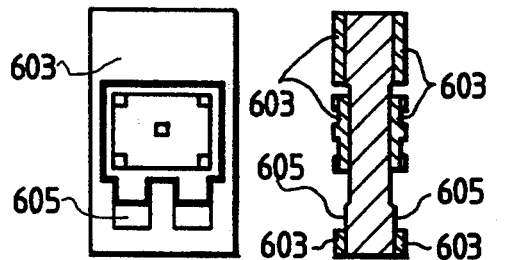
FIG. 6D  FIG. 6D'

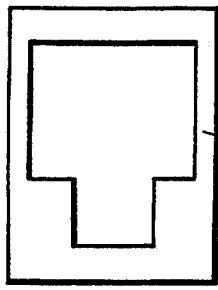 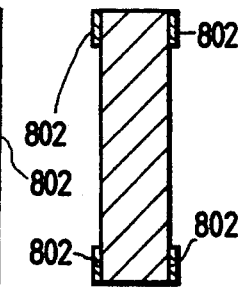 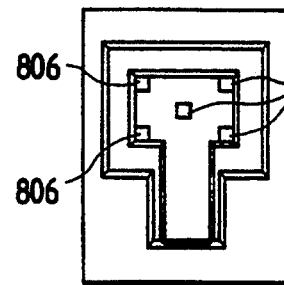 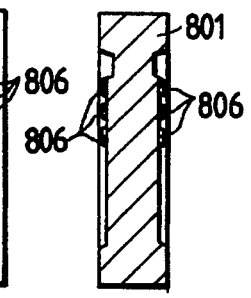
FIG. 8A  FIG. 8A'  FIG. 8E  FIG. 8E'
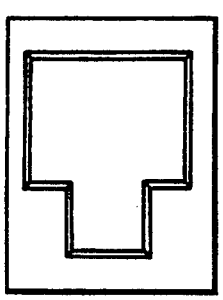 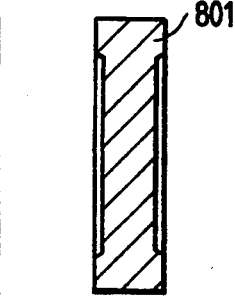 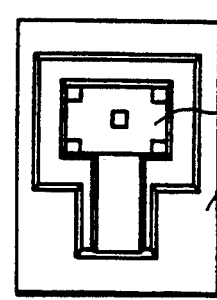 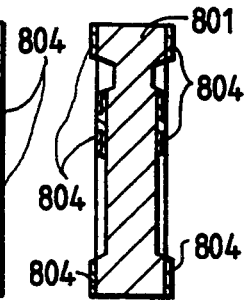
FIG. 8B  FIG. 8B'  FIG. 8F  FIG. 8F'
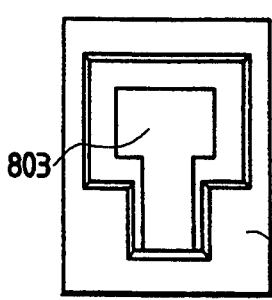 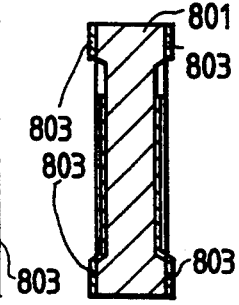 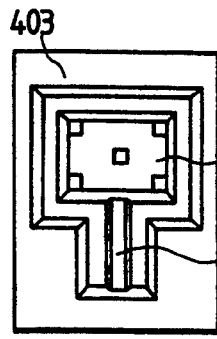 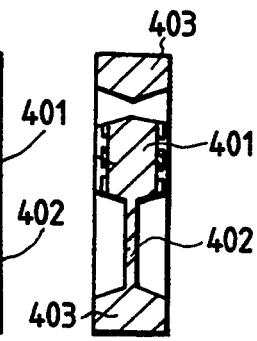
FIG. 8C  FIG. 8C'  FIG. 8G  FIG. 8G'
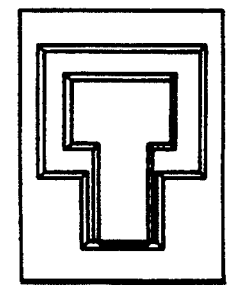 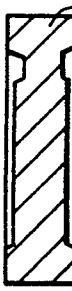
FIG. 8D  FIG. 8D'

STRUCTURE AND METHOD OF MANUFACTURING THE SAME

BACKGROUND OF THE INVENTION

The present invention relates to a structure and method of manufacturing the same, and more specifically to a method of manufacturing a structure having a specially designated shape, especially an accelerometer, using etching techniques being used in the semiconductor field.

As an example of a structure to which the manufacturing method of the present invention would be applied, a capacitive accelerometer having a cantilever beam structure with a small spring constant as shown in FIGS. 1A–1B is well known (Japanese patent application Laid-Open No. 152369/1989). The accelerometer has a three-layered structure as shown in a sectional view of FIG. 1A. Especially, the structure of a middle layer as shown in a plan view of FIG. 1B comprises a cantilever beam 108, one end of which is fixed to a part of a frame 109, and a seismic mass 107 provided at the tip of the cantilever beam 108. The seismic mass 107 and the cantilever beam 108 have a shape completely symmetric in the thickness direction. As shown in FIG. 1A, a top plate 113 and a bottom plate 114 have film electrodes 111, 112 opposite to the sides of the seismic mass 107. The upper surface and the lower surface of the seismic mass 107 create respective electrostatic capacities via the gap to the film electrodes 111, 112 on the top plate 113 and the bottom plate 114. The accelerometer outputs the inertia force on the seismic mass 107 due to acceleration as an electrical signal based on the variation of the electrostatic capacities of the gaps between the top and bottom plates. As seen from FIGS. 1A–1B, the center of gravity 110 of the seismic mass 107 is on the center axis of the cantilever beam 108 and has no cross-sensitivity.

When the accelerometer as shown in FIGS. 1A–1B is manufactured, chemical anisotropic etching of single crystal silicon is used because the dimensions of the structure can be controlled uniformly with high accuracy. A structure processed by chemical anisotropic etching can attain a shape with sharp corners being constituted by a special crystallographic plane, such as the (111) plane or the (100) plane. However, if excessive acceleration is applied, stress concentration occurs at a corner of the fixed end of the cantilever beam 108, resulting in a fracture from the fixed end of the cantilever beam 108.

As shown above, structures processed by chemical anisotropic etching have some problem of fractures due to the stress concentration of corners. Therefore, for example, as described in Japanese patent application laid-open No. 18063/1989, as means for improving the strength of the fixed end of the cantilever beam 108, a method of processing the work by chemical anisotropic etching and then providing curvatures to the sharp corners by chemical isotropic etching has been designed. According to this, the stress occurring at the fixed end of the cantilever beam is dispersed along the curvatures, resulting in the improvement of the fracture strength of the accelerometer.

However, when chemical isotropic etching is used for processing of structures, problems occur in that chemical isotropic etching must be performed not only for parts to be curved but also for parts corresponding to at least the size of the curvatures, and that since the chemical isotropic etching is diffusion-limited etching, the etching quantity is different depending on the position of the wafer. Thus, uniform processing is not possible on the whole surface of wafer. Also, a complication is added thereto in the use of two kinds of etchants together.

Further, when a structure constituted by a cantilever beam 108 with one end to the inside of a frame 109 and other end having a seismic mass 107 as shown in FIGS. 1A and 1B is manufactured, and the thickness of the frame, the cantilever beam and the seismic mass is symmetric with respect to the center axis of the thickness of the frame and the thickness decreases in the order of the frame, the seismic mass and the cantilever beam, problems occur in that it is difficult to carry out resist coating of a stepped surface with large height and pattern exposure. For example, undesirable removal of the resist layer occurs at the stepped surface and the resist thickness cannot be made uniform in upper and lower sides of the stepped surface, and thereby a portion of overexposure is produced and irregularity of etched forms is liable to occur.

SUMMARY OF THE INVENTION

Therefore, a principal object of the present invention is to realize a method of manufacturing a structure by etching to provide curvatures at necessary parts of a structure being made of a single crystal material without using chemical isotropic etching.

Another object of the present invention is to provide a structure having curvatures only at the specified parts in the surface direction and in the thickness direction, especially a pressure sensor with high accuracy and an accelerometer with high accuracy.

In order to attain the foregoing objects, in a method of manufacturing a structure for etching a wafer made of a single crystal material such as silicon or germanium and for manufacturing a wafer having curvatures in the thickness direction or in the surface direction of the wafer, wherein in the first chemical anisotropic etching process, stepped surfaces having a value more than that corresponding to the depth of the curvature are formed on the wafer using a given etching mask, and in the second chemical anisotropic etching process, etching is performed using an etching mask by removing at least a part of the etching mask used in the first chemical anisotropic etching process.

Also in a method of etching a wafer, of producing a structure constituted by a cantilever beam with one end attached to the inside of a frame and other end having a seismic mass, the thickness of the frame, the cantilever beam and the seismic mass being symmetric with respect to the center axis of the thickness of the frame, the thickness decreasing in the order of the frame, the seismic mass and the cantilever frame, and of manufacturing an accelerometer having the structure as the component, an etching mask is formed on a part to be made a frame for both surfaces of the wafer by a first photolithography process, the thickness of the wafer is reduced by a first chemical anisotropic etching process, an etching mask is formed on a part to be made the original form of a seismic mass, a frame and a cantilever beam by a second photolithography process, a stepped surface corresponding to a value at least more than half of the thickness of the frame is formed by a second chemical anisotropic etching process, an insulation film is formed on a part to be made a seismic mass by a third photolithography process, an etching mask is formed on a part to be made a seismic mass and a frame by a fourth photolithography process, and the cantilever beam and a penetrated area of its circumference are simultaneously formed by a third chemical anisotropic etching process.

Moreover, in the method of manufacturing the accelerometer, a method of manufacturing a structure is carried out in order to provide the curvature for the attached part of the cantilever beam to the frame.

As the etchant for chemical isotropic etching, an aqueous solution of potassium hydroxide, and an aqueous solution of ammonium hydroxide, ethylenediamlne and hydrazine having the same effect as the above are used.

The present invention provides curvatures on at least a certain area of etched shape only by a combination of plural chemical anisotropic etching processes by devising the etching mask. A structure due to the present invention is one made of a single crystal material composed of a frame and an internal structure placed inside the frame and having a thickness less than that of the frame, at least a part of the internal structure being attached to one end of the frame, wherein the attached part of the frame and the internal structure is constituted in a polyhedron having a curvature at least in the thickness direction and another surface formed by a plane body. The curvature radius in the thickness direction of the curvature is made 0.2 $\mu$m or more.

Further, when the present invention is applied to the constitution of an intermediate layer of the accelerometer as shown in FIGS. 1A and 1B, an accelerometer having homogeneous performance and sensitivity can be realized. Since the part of the cantilever beam that is attached to the frame has curvature, the stress concentration can be avoided and the device has longer life.

BRIEF DESCRIPTION OF THE DRAWINGS

FIGS. 5A–5F' are diagrams showing processing of the second embodiment of the method of manufacturing a structure according to the invention;

FIGS. 6A–6G' are diagrams showing processing of a third embodiment of a method of manufacturing a structure according to the invention;

FIGS. 8A–8G' are diagrams showing processing of a fifth embodiment of the invention.

DESCRIPTION OF PREFERRED EMBODIMENTS

Embodiments of the present invention will be described referring to the accompanying drawings as follows.

EMBODIMENT 1

Figure 2A:
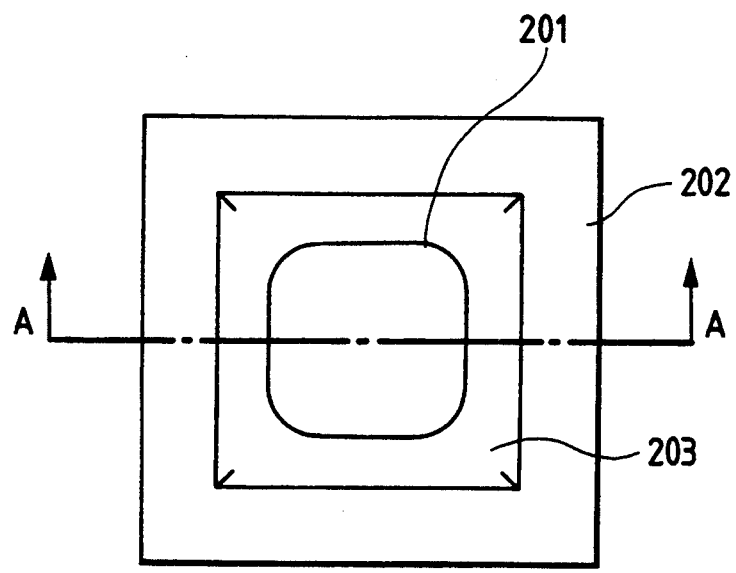
FIGS. 2A and 2B are constitutional diagrams of a pressure sensor manufactured by a first embodiment of a method of manufacturing a structure according to the invention.
Figure 2B:
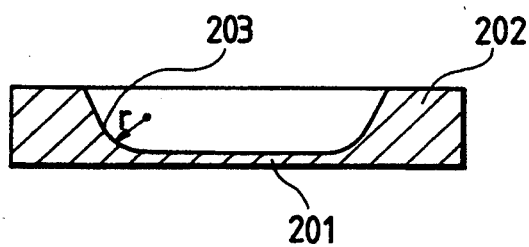

FIGS. 2A and 2B are a plan view and a sectional view taken along line A—A of FIG. 2A, respectively, a part of a pressure sensor manufactured according to a first embodiment of a method of manufacturing a structure according to the present invention. The pressure sensor of the embodiment is a structure constituted by a diaphragm 201 and a frame 202 holding the outer circumference of the diaphragm 201, the diaphragm 201 and the frame 202 being made of the same material, and a boundary part between one plane of the diaphragm 201 and the frame 202 is constituted by a polyhedron having a combination of curvatures (for example, at 203 (radius r) in the thickness direction) formed in the thickness direction and in the plane direction, and a plane body formed in other part. The length of the curvature (circular arc) 203 is dependent on the process conditions, that is, composition of etchant, temperature, pattern dimensions of a photo mask used in each process and quantity of etching. Especially, the curvature part 203 in the thickness direction has a curvature radius r being 0.2 $\mu$m or more, whereby the material fatigue based on the stress concentration due to pressure is reduced. Further, in this embodiment, only one plane of the diaphragm 201 is adjacent to the plane having the frame 202 and the curvature 203, but both surfaces of the diaphragm 201 may be provided with the frame 202 and the curvature.

Figure 3A:
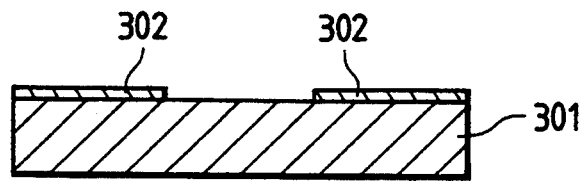
FIGS. 3A, 3B, 3C and 3D are sectional views showing processing of the pressure sensor in FIG. 2A.
Figure 3B:
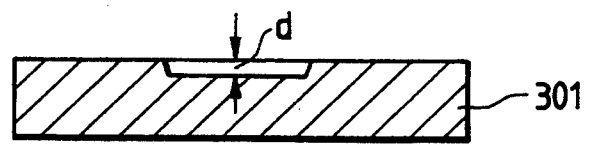
Figure 3C:
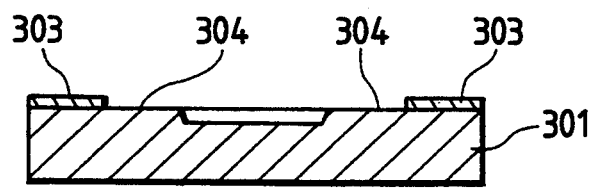
Figure 3D:
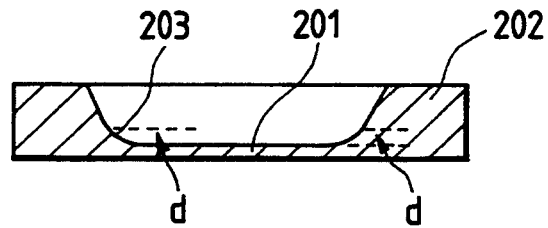

FIGS. 3A, 3B, 3C, 3D are sectional views showing processing of the pressure sensor of FIG. 2A. In the step of FIG. 3A, a first etching mask 302 is formed of $SiO_2$ or $Si_3N_4$ on the surface of one side of the wafer 301 by the first photolithography process. In the step of FIG. 3B, the masked surface of the wafer 301 is stepped, having at least a dimension of the curvature 203, that is, the value d not less than the vertical depth of the curvature 203 by chemical anisotropic etching with an aqueous solution of potassium hydroxide. The shape of the curvature 203 can be controlled by varying the etching amount in this process. In the step of FIG. 3C, a second etching mask 303 having an offset 304 being made of $SiO_2$ or $Si_3N_4$ is formed from the first etching mask 302 onto the surface of the wafer 301 processed in the step of FIG. 3B by the first photolithography process. In the step of FIG. 3D, in the etching mask surface of the wafer 301, the diaphragm 201 is made a given thickness by chemical anisotropic etching using an aqueous solution of potassium hydroxide. The surface of the offset 304 is etched, providing a stepped surface with height parallel to the surface of the diaphragm 201. A side surface of the offset 304 at the side of the diaphragm 201 is side-etched in the direction of the frame 202, its form having curvature from the plane.

When the diaphragm 201 becomes the desired thickness, the side surface of the curvature due to the offset 304 reaches just to the frame 202 and attains the curvature 103. When the etching speed of the wafer surface 201 is Rw, the etching speed Rs by which the offset 304 is side-etched becomes $$Rw:Rs = 1:1.8 \qquad (1)$$

By using this value, dimensions of the offset 304 used in FIG. 3C are determined. That is, when the wafer thickness is Wh, the diaphragm thickness is Dh, and the length of one side of the first etching mask 302 is $L_1$.

Considering the (111) plane produced by the chemical anisotropic etching, it follows that $$L_1 = Dd + 2(Wh - Dh)/\tan(54.7°) - 2(Wh - Dh - Rh) \times 1.8 \quad (2)$$

For example, when a pressure sensor having the thickness of the wafer 301 equal to 270 m, the length Dd of one side of the diaphragm 202 is 1500 m, the thickness Dh is 25 μm, and the size Rh of the curvature 203 being is 20 μm. It follows that $$L_1 = 1500 + 2(270-25)/\tan(54.7°) - 2(270-25-20) \times 1.8 = 1037 \text{ μm}$$

Next, in the manufacturing process of FIG. 3B, the stepped surface of 20 μm is formed by the chemical anisotropic etching with an aqueous solution of potassium hydroxide. The dimension L₂of one side of a window opened as an etching surface by means of the second etching mask 303 of FIG. 3C is determined by the dimension Dh of the diaphragm 201 as follows:

$$L_2 = Dd + 2(Wh - Dh)/\tan(54.7°) \quad (3)$$

Substituting the above mentioned values, it follows that $$L_2 = 1500 + 2(270-25)/\tan(54.7°) = 1847 \text{ μm}$$

In the manufacturing process of FIG. 3D, etching of 225 μm is performed by the chemical anisotropic etching with an aqueous solution of potassium hydroxide so that the thickness of the diaphragm 201 becomes 25 μm.

EMBODIMENT 2

Figure 4A:
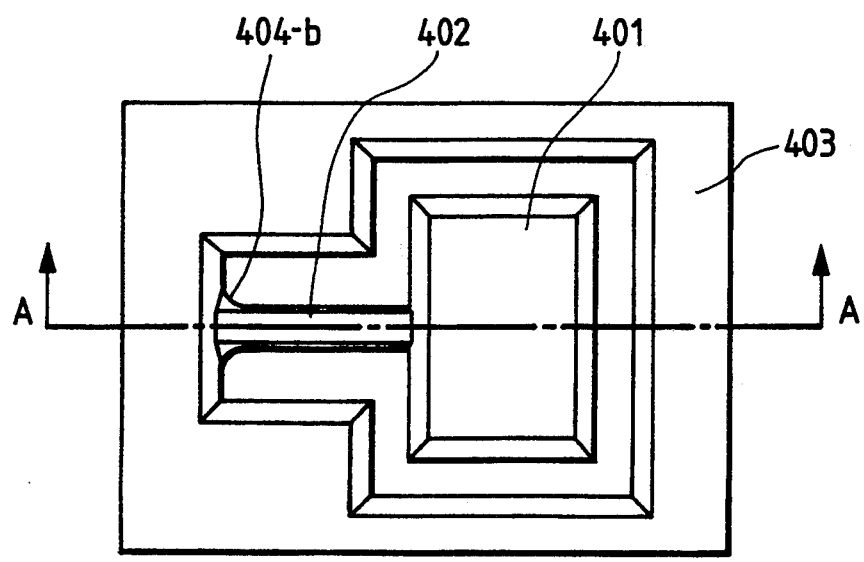
FIGS. 4A and 4B are constitutional diagrams of a principal part of an accelerometer manufactured by a second embodiment of a method of manufacturing a structure according to the invention.
Figure 4B:
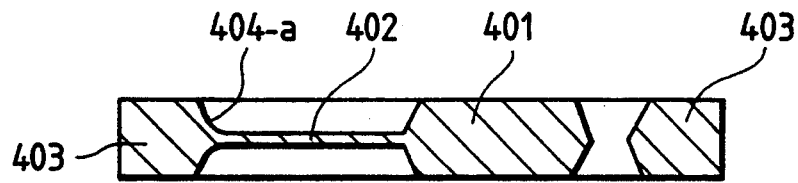

FIGS. 4A and 4B are a plan view of a principal part of an accelerometer manufactured by a second embodiment of a method of manufacturing a structure according to the present invention and a sectional view taken along line A—A part of FIG. 4A, respectively.

Figure 1A:
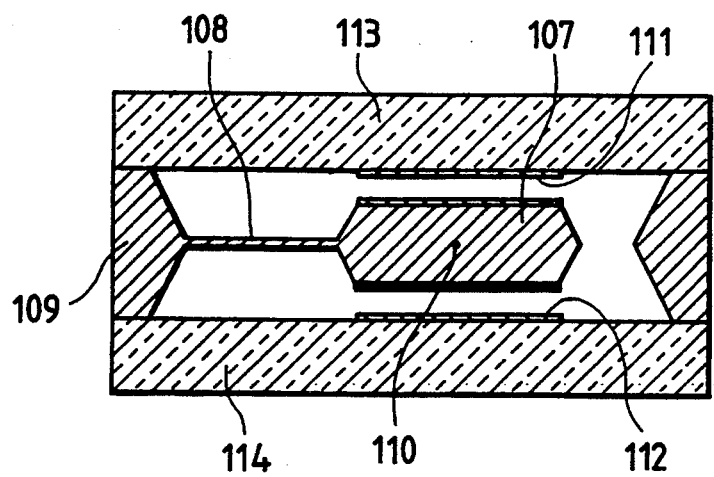
FIGS. 1A and 1B are diagrams showing the constitution of an accelerometer.
Figure 1B:
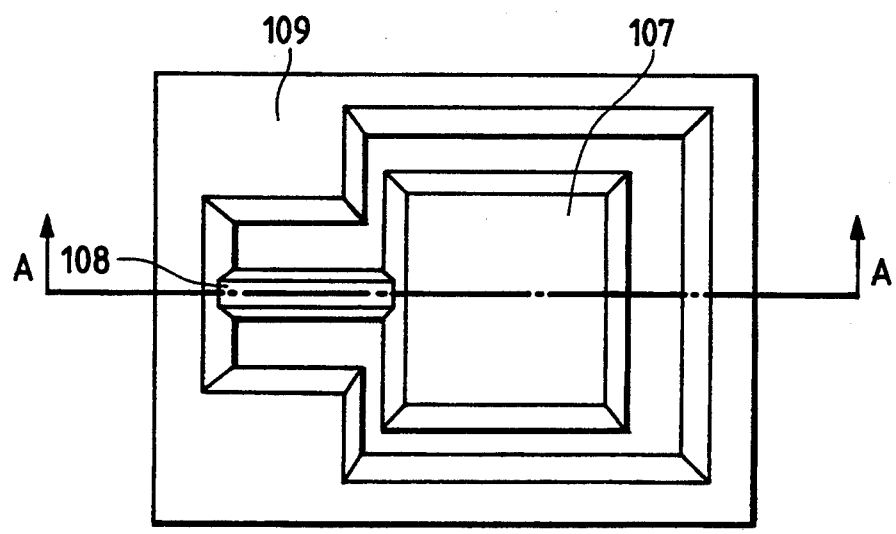

The constitution and principle of the accelerometer of the present embodiment are substantially the same as those of FIG. 1, and according to the construction of the middle layer of FIG. 1, the difference between them is that curvatures 404-a, b are formed at the fixed end of the cantilever beam 402 to the side of the frame 403.

FIGS. 5A–5F' show manufacturing process steps of the second embodiment of the method of manufacturing a structure according to the present invention, where the accelerometer shown in FIGS. 4A and 4B is manufactured. In this process, a curvature 404-a in the direction of etching depth and a curvature 404-b in the wafer are simultaneously formed. In the manufacturing step of FIGS. 5A and 5B', the first etching mask 502 of SiO₂ or Si₃N₄ is formed on the surfaces of the front and back sides of the wafer 501. In the manufacturing process of FIG. 5B, a stepped surface having a value of at least the size of the curvature 404-a is formed from the surfaces of the front and back sides of the wafer 501 simultaneously by chemical anisotropic etching with an aqueous solution of potassium hydroxide. The shape of the curvature 404-a in the direction of depth is determined by the etching amount in this process.

In the manufacturing step of FIGS. 5C and 5C', the second etching mask 503 of SiO₂ or Si₃N₄ is formed on the surfaces of the front and rear sides of the wafer 501. In the manufacturing step of FIGS. 5D and 5D', a stepped surface having a value of at least half the thickness of the cantilever beam is formed from the surfaces at the front and back sides simultaneously by chemical anisotropic etching with an aqueous solution of potassium dioxide. The shape of the side surface of the cantilever beam 402 and the shape of the side surface of the curvature 404-b in the wafer plane are controlled by the etching amount in this process. In the manufacturing step of FIGS. 5E and 5E', a third etching mask 504 having an offset 505 on a part of the frame 403, from the first and second etching masks 502, 503 to the side of the cantilever beam 402 (a part of the etching mask 503 to be made the cantilever beam 402 having been removed) and being made of SiO₂ or Si₃N₄ is formed on the surfaces at the front and back sides of the wafer 501.

In the manufacturing step of FIG. 5F, the cantilever beam 402 is made a specified thickness by chemical anisotropic etching with an aqueous solution of potassium hydroxide from the surfaces at the front and back sides of the wafer 501 simultaneously, and the periphery of the cantilever beam part is penetrated. The stepped side surface of the offset 505 and a part to be made the cantilever beam 402 are side etched while the shape is varied from a plane shape into a shape having curvature. The shape of a part at the fixed end of the cantilever beam 402 at the side of the frame is varied to a shape having curvature with the progress of the side etching. The size of the curvature part 404-b in the wafer plane is determined by the etching amount and the dimension of the offset 505 in this case. The relationship between the etching speed Rs with which the offset and a part of the cantilever beam 402 are side etched and the etching speed Rw of the surface of the wafer 401 is shown by equation (1).

By using this value, the dimension of the mask pattern becoming a prototype of the cantilever beam 402 of the second etching mask 503 used in FIG. 5C and the dimension of the offset 505 are determined. That is, when the wafer thickness is Wh, the cantilever beam thickness is Hh, the size of the curvature 404-a is Rh, and the size of the curvature 404-b is Rb. The width Lh of the part becoming a prototype of the cantilever beam 402 of the second etching mask 503 in. FIG. 5C becomes $$Lh = Hb + 2 \times (Wh/2 - Rh - Hh/2) \times 1.8 \quad (4)$$

and the dimension Lo of the offset 505 in FIG. 5E becomes $$Lo = (Wh/2 - Hh/2)/\tan(54.7°) + (Wh/2 - Rh - Hh/2) \times 1.8 \quad (5)$$

As a concrete example of the curvature processing at the fixed beam of the cantilever beam, the manufacturing process conditions will be shown as follows where the thickness of the wafer 501 is 220 μm, the width of the cantilever beam is 200 μm, the thickness of the cantilever beam is 15 μm, the size of the curvature 404-a is 20 μm, and the size of the curvature 404-b is 160 μm. The stepped surface of 20 μm for the curvature 404-a is formed on the surfaces at the front and back sides of the wafer 501 by the chemical anisotropic etching in FIGS. 5B and 5B'. The dimension of width Lh of the part becoming a prototype of the cantilever beam 402 of the second etching mask 503 in FIGS. 5C and 5C' from equation (4) becomes $$Lh = 200 + (220/21 - 20 - 15/2) \times 1.8 = 497 \text{ μm}$$

In FIGS. 5D and 5D', the surfaces at the front and back sides of the wafer 501 are etched by 7.5 μm by the chemical anisotropic etching. The dimension Lo of the offset 505 in FIGS. 5E and 5E' can be obtained from dimensions of slope of the (111) plane formed by the etching in FIGS. 5B, 5B', 5F and 5F' and the side etching amount in FIG. 5F. From equation (5), Lo becomes $$Lo = (200/2 - 15/2) - /\tan(54.7°) + (220/2 - 20 - 15/2) \times 1.8 = 221 \ \mu m$$

In FIGS. 5F and 5F', the cantilever beam is etched until the desired thickness of 15 μm is attained, and the periphery of the cantilever beam is penetrated.

EMBODIMENT 3

FIGS. 6A-6G show a manufacturing process in a third embodiment of a method of manufacturing a structure according to the present invention. The present embodiment is also concerned with another method of manufacturing a middle layer of an accelerometer. In the manufacturing step of FIGS. 6A and 6A', the first etching mask 601 of $SiO_2$ or $Si_3N_4$ is formed on a part to be made the frame 403 of the surfaces at the front and back sides of the wafer 601. In the manufacturing step of FIGS. 6B and 6B', the wafer 601 is etched by the value corresponding to the gap forming the electrostatic capacity in the simultaneous etching of the surfaces at the front and back sides of the wafer 601 by chemical anisotropic etching with an aqueous solution of potassium hydroxide. The shape of the curvatures at the fixed end of the cantilever beam in the beam thickness direction is controlled by the etching amount.

In the manufacturing step of FIGS. 6C and 6C', an insulation film 606 of $SiO_2$ or $Si_3N_4$ is partially formed on the surfaces at the front and back sides of the wafer 601. The position of the insulation film 606 coincides with five points at corners and the center of the part to be made the seismic mass 401. The insulation film 606 is attached so that even if the seismic mass 401 contacts the film electrodes 111, 112 of the two upper and lower layers 113, 114 shown in FIG. 1, neither is short-circuited.

In the manufacturing step of FIGS. 6D and 6D', the second etching mask 603 having an offset 605 and being made of $SiO_2$ or $Si_3N_4$ is formed on the seismic mass 401 of the surfaces at the front and back sides of the wafer 601 and the frame 403 of the first etching mask 602 at the cantilever beam side.

In the manufacturing step of FIGS. 6E and 6E', at the seismic mass 401 of the surfaces at the front and back sides of the wafer 601, the frame 403 and a part becoming a prototype of the cantilever beam 402, the third etching mask 604 of $SiO_2$ or $Si_3N_4$ is formed in overlaying on the second etching mask 603.

In the manufacturing step of FIGS. 6F and 6F', after the surfaces at the front and back sides of the wafer 601 are simultaneously etched by a depth corresponding to at least a value not less than half the cantilever beam thickness by chemical anisotropic etching with an aqueous solution of potassium hydroxide, only the third etching mask 604 on the surfaces at the front and back sides of the wafer 601 is removed and the second etching mask 603 remains. The ultimate shape of the side surface of the cantilever beam 402 and the curvature shape at the fixed end of the cantilever beam in the wafer plane are controlled by the etching amount of the wafer in this manufacturing process.

The following two methods exist as methods of removing the third etching mask 604 only. The first method is that the film thickness of the second etching mask 603 is made more than that of the third etching mask 604. That is, the whole surface etching is carried out by an etchant for the etching mask, film thicknesses of both the second etching mask 603 and the third etching mask 604 become thinner, and the third etching mask 604 with less film thickness is first removed and the second etching mask 603 remains by the amount of the film thickness thicker than that of the third etching mask 604. For example, when a thermal oxidation film is used as an etching mask material, the thermal oxidation film of 1.0 μm is used as the second etching mask 603, and on the above film, the thermal oxidation film of 0.4 μm is formed as the third etching mask 604. Since the thicker the thermal oxidation film, the slower the growth of the oxidation film, the film thickness of the second etching mask 603 becomes about 1.1 μm. As a result, the film thickness of the second etching mask 603 remaining after removing the third etching mask 604 is about 0.7 μm, and this is not less than the thickness 0.5 μm of $SiO_2$ necessary as the mask of the final etching.

The second method is in that a material for the second etching mask 603 and a material for the third etching mask 604 are different in selectivity to etchants. That is, if the whole surface etching is carried out by the etchant into which only the third etching mask 604 is selectively dissolved, only the etching mask 603 remains without being etched. For example, if $Si_3N_4$ is used as the material for the second etching mask 603 and $SiO_2$ is used as the material for the third etching mask 604, only $SiO_2$ is dissolved into the etchant using hydrofluorine, and $Si_3N_4$ remains. Thus only the third etching mask 604 can be removed.

In the manufacturing step of FIG. 6G, the chemical anisotropic etching with the aqueous solution of potassium hydroxide is carried out simultaneously from the surfaces at the front and back sides of the wafer 601 using the second etching mask 603, the cantilever beam 402 is thinned and made the intended film thickness the periphery of the cantilever beam 402 is penetrated and curvature is provided at the fixed end of the cantilever beam. By this process, the seismic mass 401 is supported to the frame 403 only by the cantilever beam 402 having curvature at its fixed end, and the middle layer of the capacitive accelerometer is formed. Curvature at the fixed end of the cantilever beam grows with etching, and is formed at the fixed end of the cantilever beam at the end of etching. When manufacturing is effected using an aqueous solution of potassium hydroxide of 40% weight at the etching temperature of the ratio between the etching rate Rh in the direction of beam thickness and the etching rate Rr in the curvature forming direction becomes $$Rh:Rr \approx 1:1.8 \quad (6)$$

The dimension of the offset 605 in FIGS. 6D and 6D' is determined respecting the etching rate in the direction of cantilever beam width. That is, when the etching amount in the direction of beam thickness is Hh, the etching amount Hr in the curvature direction based on equation (6) becomes $$Hr = Hh \cdot Rr/Rh = 1.8 \cdot Hh \quad (7)$$

and from equation (7), the dimension Ho of the offset 605 becomes $$Ho = Hr + Hh/\tan(54.7°) = 2.5 \cdot Hh \quad (8)$$

The width of the cantilever beam 402 becomes narrow with the etching, and attains the desired dimension at the time of finishing the etching. When manufacturing is effected using an aqueous solution of potassium hydroxide of 40% weight at the etching temperature of 70° C., the ratio between the etching rate Rh in the direction of beam thickness and the etching rate Rb in the direction of beam width becomes $$Rh : Rb \approx 1:1.8 \qquad (9)$$

The dimension of the part becoming a prototype of the cantilever beam 402 in FIGS. 6E and 6E' is determined respecting the etching rate in the direction of beam width. That is, when the etching amount in the direction of beam thickness is Hh, the etching amount Hb in the direction of beam width from equation (9) becomes $$Hb = Hh \cdot Rb/Rh = 1.8 \cdot Hh \qquad (10)$$

and when the width of the prototype of the cantilever beam 402 of the third etching mask 604 is H, the cantilever beam width Hw of the accelerometer from equation (10) becomes $$Hw = H - 2 \cdot Hb = H - 3.6 \cdot Hh \qquad (11)$$

Thereby the width H of the prototype of the cantilever beam 402 of the third etching mask 604 becomes $$H = Hw + 3.6 \cdot Hh \qquad (12)$$

As a concrete example, when the manufacturing is carried out for the wafer thickness being 220 $\mu$m, the gap to form the electrostatic capacity being 3.5 $\mu$m, the beam width being 200 $\mu$m and the beam thickness being 15 $\mu$m, the stepped surface of 3.5 $\mu$m is formed using the chemical anisotropic etching in the manufacturing process of FIGS. 6A, 6A', 6B and 6B'. The dimension Ho of the offset 605 used in the manufacturing process of FIGS. 6D, 6D', 6E and 6E' and the width H of the prototype of the cantilever beam 402 of the third etching mask 604 respectively from equations (5), (9) become $$Ho = 2.5 \cdot (220/2 - 3.5 - 15/2) = 247.5 [\mu m]$$

$$H = 200 + 3.6 \cdot (220/2 - 3.5 - 15/2) = 556.4 [\mu m]$$

Using this etching mask, the chemical anisotropic etching of depth at least 7.5 $\mu$m or more is carried out in the manufacturing process of FIGS. 6F and 6F'. In the manufacturing process of FIGS. 6F, 6F', 6G and 6G', if only the third etching mask 604 is removed and the chemical anisotropic etching is further carried out with the second etching mask 603, the offset 605 and the cantilever beam 402 are thinned and form curvatures while the stepped surface with the circumference is kept constant, and the beam width is decreased. When the periphery of the cantilever beam 402 is penetrated and the beam thickness attains the intended value of 15 $\mu$m, curvature construction is formed at the fixed end of the cantilever beam and the beam width also attains the intended value of 200 $\mu$m. Since chemical anisotropic etching with aqueous solution of potassium hydroxide is used, the shape of the side surface of the cantilever beam 402 is formed with a sharp line.

In the above-mentioned manufacturing process, the chemical anisotropic etching is used instead of the chemical isotropic etching, because the chemical isotropic etching is diffusion-limited etching, and thereby it is difficult to carry out the processing of the same etching amount on the whole surface of wafer. For example, one of the important factors determining characteristics of the capacitive accelerometer is the electrostatic capacity formed between the surfaces at the front and back sides of the seismic mass 107 and the film electrodes 111, 112 of the two upper and lower layers 113, 114 as shown in FIG. 1A. Accordingly, if the chemical isotropic etching is used when the gap forming the electrostatic capacity is processed in the manufacturing process of FIG. 6B and 6B', the etching amount is dispersed depending on the position of the wafer, and characteristics of the accelerometer become different according to the position of the wafer. Regarding the above, the chemical anisotropic etching has little difference in the etching amount due to the position of the wafer because its etching rate is reaction-limited etching, and the an accelerometer having uniform characteristics can be manufactured.

EMBODIMENT 4

FIGS. 7A–7G' are diagrams showing manufacturing steps in a fourth embodiment of a method of manufacturing a structure according to the present invention. The present embodiment also relates to a. method of manufacturing a middle layer of a capacitive accelerometer.

Figure 7A:
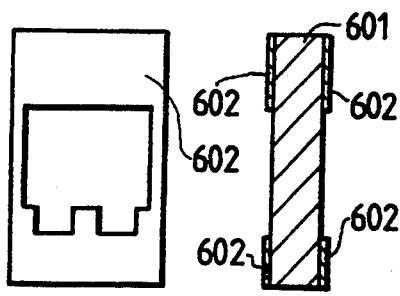
FIGS. 7A–7G are diagrams showing processing of a fourth embodiment of a method of manufacturing a structure according to the invention.
Figure 7E:
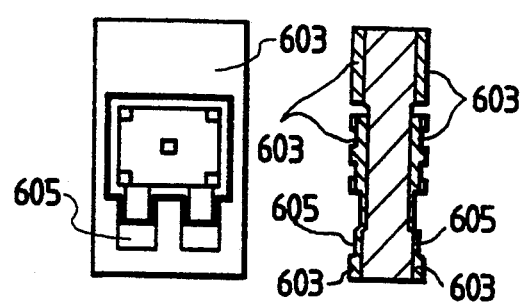
Figure 7B:
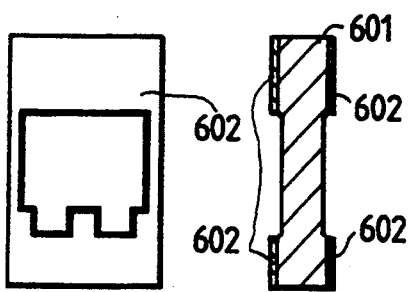
Figure 7F:
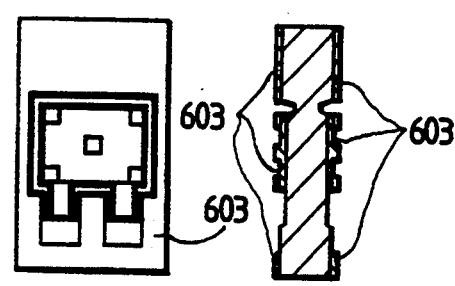
Figure 7C:
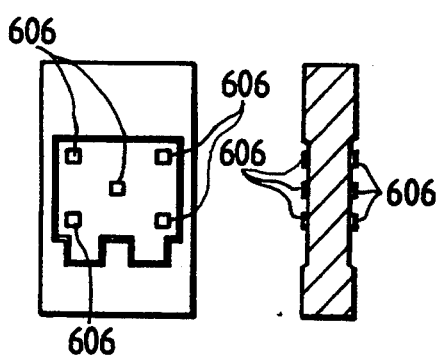
Figure 7G:
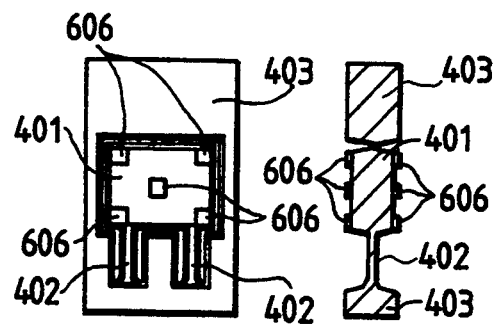
Figure 7D:
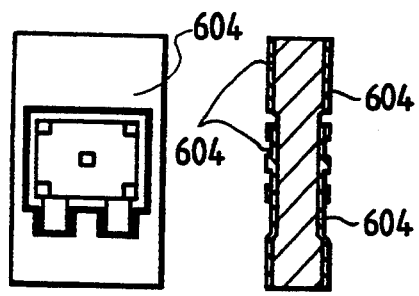

In the present embodiment, the manufacturing steps in FIGS. 7A through 7C' and FIGS. 7F through 7G' are the same as those in FIGS. 6A through 6C and FIGS. 6F through 6G' respectively. In the manufacturing step of FIG. 7D and 7D', the third etching mask 604 of SiO$_2$ or Si$_3$N$_4$ is formed on the seismic mass 401 of the surfaces at the front and back sides of the wafer 601, the frame 403 and the part becoming a prototype of the cantilever beam 402. In the manufacturing step of FIG. 7E and 7E', on the seismic mass 401 of the surfaces at the front and back sides of the wafer 601 and the frame 403 of the first and third etching masks 602, 604 at the beam side, the second etching mask 603 having the offset 605 and being made of SiO$_2$ or Si$_3$N$_4$ is formed to overlay the third etching mask 604.

EMBODIMENT 5

FIGS. 8A through 8G are diagrams showing manufacturing steps in a fifth embodiment of a method of manufacturing a structure according to the present invention. The present embodiment relates to a method of manufacturing a middle layer of a capacitive accelerometer shown in FIG. 1. The present embodiment is effective especially in the case that the problem of the stress concentration of the attaching part of the cantilever beam to the frame need not be considered.

The number of cantilever beams is one, comparable with the embodiments shown in FIGS. 6, 6A through 7G', but there is no essential difference concerning the manufacturing method.

The manufacturing steps in FIGS. 8A through 8B' are the same as those in FIGS. 7A through 7B respectively. In the manufacturing step of FIGS. 8C and 8C', a second etching mask 803 of SiO$_2$ or Si$_3$N$_4$ is formed on the seismic mass 401 of the surfaces at the front and back sides of a wafer 801, the frame 403 and the part becoming a prototype of the cantilever beam 402.

In the manufacturing step of FIGS. 8D and 8D', the surfaces at the front and back sides of the wafer 801 are simultaneously etched by a depth corresponding to a value of at least half the beam thickness or more by the chemical anisotropic etching with an aqueous solution of potassium hydroxide. The ultimate shape of the side surface of the cantilever beam 507 is controlled by the etching amount in this manufacturing step. In the manufacturing step of FIGS. 8D and 8D', an insulation film 806 $SiO_2$ or $Si_3N_4$ is formed on five points of corners and the center of the seismic mass 401 on the surfaces at the front and back sides of the wafer 801 so that even if the seismic mass 401 and the film electrodes 111, 112 of the two upper and lower layers 113, 114 in FIG. 1 contact, both are insulated from each other.

In the manufacturing step of FIGS. 8F and 8F', a third etching mask 804 of $SiO_2$ or $Si_3N_4$ is formed on the seismic mass 401 on the surfaces at the front and back sides of the wafer 801 and the part becoming the frame 403.

In the manufacturing step of FIGS. 8G and 8G', the chemical anisotropic etching with aqueous solution of potassium hydroxide is carried out simultaneously on the surfaces at the front and back sides of the wafer 801, the cantilever beam 402 is thinned and made the intended beam thickness and the periphery of the cantilever beam 402 is penetrated. Thereby the seismic mass 401 is supported to the frame 403 only by the cantilever beam 402, and the middle layer of the capacitive accelerometer shown in FIG. 1 is formed. The width of the cantilever beam 402 is narrowed with the etching, and becomes the intended dimension at the time of finishing the etching. When etching is carried out by using an aqueous solution of potassium hydroxide in 40 weight %, the ratio of the etching rate Rh in the direction of beam thickness to the etching rate Rr in the direction of beam width becomes $$Rh:Rr = 1:1.8 \qquad (13)$$

The dimensions of the part becoming the prototype of the cantilever beam 402 in FIGS. 8C and 8C' are determined anticipating the etching rate in the direction of beam width. That is, when the etching amount in the direction of beam thickness is Hh, the etching amount Hb in the direction of beam width from equation (6) becomes $$Hb = Hh \cdot Rr/Rh = 1.8 \cdot Hh \qquad (14)$$

and when the width of the prototype of the cantilever beam of the second etching mask is H, the beam width Hw of the accelerometer from equation (14) becomes $$Hw = H - 2 \cdot Hb = H - 3.6 \cdot Hh \qquad (15)$$

Thereby the width H of the prototype of the cantilever beam of the second etching mask becomes $$H = Hw + 3.6 \cdot Hb \qquad (16)$$

As a concrete example, when the manufacturing is carried out for the wafer thickness of 220 μm, the gap to form the electrostatic capacity being 3 μm, the beam width being 200 μm and the beam thickness being 15 μm, a stepped surface of 3 μm is formed using the chemical anisotropic etching in the manufacturing process of FIGS. 8A through 8B'. The width of the prototype of the cantilever beam of the second etching mask used in the manufacturing process of FIGS. 8C through 8D' from equation (16) becomes $$H = 200 + 3.6 \cdot (200/2 - 3 - 15/2) = 558 \text{ μm}$$

Using this etching mask, chemical anisotropic etching of depth at least 7.5 μm or more is carried out in the manufacturing step of FIGS. 8D and 8D'. In the manufacturing process of FIGS. 8F through 8G', if only the etching mask on the part becoming the prototype of the cantilever beam is removed from the second etching mask and further the chemical anisotropic etching is carried out, the cantilever beam 402 is thinned and narrowed while the stepped surface with the circumference of the beam is kept constant, and the periphery of the cantilever beam is penetrated. Through this process, when the beam thickness becomes the intended value of 15 μm, the beam width also becomes the intended value of 200 μm. Since the chemical anisotropic etching with aqueous solution of potassium hydroxide is used, the etching shape of the cantilever beam 402 is a sharp line.

According to the present embodiment, since the processing is carried out by only the chemical anisotropic etching, the dispersion of the gap forming the electrostatic capacity of the sensor shown in FIG. 1 can be reduced. That is, as the etching rate in the chemical anisotropic etching is reaction-limited etching, there is no difference of the etching amount according to the position of wafer, and an accelerometer having homogeneous characteristics can be realized.

A thin beam having a curvature construction at the fixed end can be formed in the center of the seismic mass thickness by the chemical anisotropic etching process only. Therefore, the middle layer of the capacitive accelerometer having good cross-sensitivity and large fracture strength can be processed uniformly with good yield.

What is claimed is:

1. A method of manufacturing a semiconductor accelerometer wherein a wafer is processed in an etching process and a structure having a cantilever beam with one end attached to the inside of a frame and the other end having a seismic mass is produced, characterized in that the wafer is processed according to a plurality of anisotropic etching steps to produce a curvature on the end of said cantilever beam that is fixed to said frame, and further comprising:

a first photolithography process of forming a first etching mask to a part of the wafer to become a frame on opposite surfaces of said wafer;

a first one of said plurality of anisotropic etching steps of narrowing a thickness of the wafer in accordance with said first etching mask;

a second photolithography process of forming an insulation film at least partially to a part of the wafer to become the seismic mass;

a third photolithography process of forming a second etching mask over the seismic mass and the part of the wafer to become the frame;

a fourth photolithography process of forming a third etching mask overlying said second etching mask, the frame, a part of said wafer to become a prototype of the beam, and a part of said wafer to become a prototype of the curvature on the fixed end of the beam;

a second one of said plurality of anisotropic etching steps of forming a stepped surface having a depth corresponding to at least half of the thickness of the beam, followed by allowing the second etching mask to remain but removing the third etching mask; and a third one of said plurality of anisotropic etching steps of forming the beam, a penetrating part at its periphery, and the curvature on the fixed end of the beam simultaneously.

2. A method of manufacturing a semiconductor accelerometer as set forth in claim 1, wherein the film thickness of the second etching mask is made thicker than that of the third etching mask.

3. A method of manufacturing a semiconductor accelerometer as set forth in claim 1, wherein the film thickness of the second etching mask is made thinner than that of the third etching mask.

4. A method of manufacturing an accelerometer as set forth in claim 3, wherein the etchant to be used in the first and second anisotropic etching steps is an aqueous solution including any of potassium hydroxide, ammonium hydroxide, ethylenediamine and hydrazine.

5. A method of manufacturing an accelerometer as set forth in claim 2, wherein the etchant to be used in the first and second anisotropic etching steps is an aqueous solution including any of potassium hydroxide, ammonium hydroxide, ethylenediamine and hydrazine.

6. A method of manufacturing a semiconductor accelerometer as set forth in claim 1, wherein the second etching mask and the third etching mask are made of mask materials that are different in selectivity of the etchants used in the second anisotropic etching step.

7. A method of manufacturing an accelerometer as set forth in claim 6, wherein the etchant to be used in the first and second anisotropic etching steps is an aqueous solution including any of potassium hydroxide, ammonium hydroxide, ethylenediamine and hydrazine.

8. A method of manufacturing an accelerometer as set forth in claim 1, wherein the etchant to be used in the first and second anisotropic etching steps is an aqueous solution including any of potassium hydroxide, ammonium hydroxide, ethylenediamine and hydrazine.

9. A method of manufacturing a semiconductor accelerometer wherein a wafer is processed in an etching process and a structure having a cantilever beam with one end attached to the inside of a frame and the other end having a seismic mass is produced, characterized in that the wafer is processed according to a plurality of anisotropic etching steps to produce a curvature on the end of said cantilever beam that is fixed to said frame, and further comprising:

a first photolithography process of forming a first etching mask to a part of the wafer to become a frame on opposite surfaces of said wafer;

a first one of the plurality of anisotropic etching steps of narrowing a thickness of the wafer in accordance with the first etching mask;

a second photolithography process of forming an insulation film to a part of the wafer to become the seismic mass;

a third photolithography process of forming a second etching mask over the seismic mass, the frame, a part of the wafer to become a prototype of the beam, and a part of the wafer to become a prototype of the curvature on the fixed end of the beam;

a fourth photolithography process of forming a third etching mask overlying said second etching mask;

a second one of the plurality of anisotropic etching steps of forming a stepped surface having a depth corresponding to at least half the thickness of the beam, followed by allowing the third etching mask to remain but removing the second etching mask; and a third one of the plurality of anisotropic etching steps of forming the beam, a penetrating part at its periphery, and the curvature on the fixed end of the beam simultaneously.

10. A method of manufacturing a semiconductor accelerometer as set forth in claim 5, wherein the second etching mask and the third etching mask are made of mask materials that are different in selectivity of etchants used in the second anisotropic etching step.

11. A method of manufacturing an accelerometer as set forth in claim 10, wherein the etchant to be used in the first and second anisotropic etching steps is an aqueous solution including any of potassium hydroxide, ammonium hydroxide, ethylenediamine and hydrazine.

12. A method of manufacturing an accelerometer as set forth in claim 9, wherein the etchant to be used in the first and second anisotropic etching steps is an aqueous solution including any of potassium hydroxide, ammonium hydroxide, ethylenediamine and hydrazine.

13. A method of manufacturing a wafer structure to have a curvature in a thickness direction thereof, comprising:

a first step of anisotropically etching the wafer to form a stepped surface using a prescribed etching mask; and a second step of anisotropically etching the wafer, after removing at least a part of the etching mask used in the first anisotropic etching step, to thereby impart a curvature to the stepped surface;

wherein the first anisotropic etching step is performed so that the stepped surface has a depth at least as great as the depth of the portion of the stepped surface to which the curvature is imparted in the second anisotropic etching step.

14. A method of manufacturing an accelerometer as set forth in claim 13, wherein the etchant to be used in the first and second anisotropic etching steps is an aqueous solution including any of potassium hydroxide, ammonium hydroxide, ethylenediamine and hydrazine.

15. A method of manufacturing a wafer structure to have a curvature in a plane direction thereof, comprising:

a first step of anisotropically etching the wafer to form a stepped surface using a prescribed etching mask; and a second step of anisotropically etching the wafer, after removing at least a part of the etching mask used in the first anisotropic etching step, to thereby impart a curvature to the stepped surface.

16. A method of manufacturing an accelerometer as set forth in claim 15, wherein the etchant to be used in the first and second anisotropic etching steps is an aqueous solution including any of potassium hydroxide, ammonium hydroxide, ethylenediamine and hydrazine.

17. A method of manufacturing a pressure sensor from a wafer wherein a diaphragm made of the same material as that of a frame is arranged at the inside of the frame, and a boundary part between the frame and the diaphragm has a construction of a curvature in a thickness direction and in a plane direction of the frame and diaphragm, characterized in that a first etching mask is formed to a part of the wafer to become the frame in a first photolithography process, and etching is performed to a depth not less than the resulting depth of the curvature, a second etching mask that is coextensive in masking area with a portion of the area masked by said first etching mask is formed, and anisotropic etching is performed using the second etching mask to form the diaphragm, the frame and the curvature.

18. A method of manufacturing an accelerometer as set forth in claim 17, wherein the etchant to be used in the first and second anisotropic etching steps is an aqueous solution including any of potassium hydroxide, ammonium hydroxide, ethylenediamine and hydrazine.

19. A method of manufacturing an accelerometer from a wafer constituted by a cantilever beam with one end attached to a frame at the inside of the frame and other end having a seismic mass, the cantilever beam and the seismic mass being symmetric with respect to the center axis of the thickness of the frame, and the thickness is decreased in the order of the frame, the seismic mass and the cantilever beam, said method comprising:
 a first photolithography process of forming an etching mask to opposite surfaces of a part of the wafer forming the frame;
 a first anisotropic etching step of narrowing a thickness of the wafer;
 a second photolithography process of forming an etching mask over the seismic mass, the frame and a part of the wafer to a prototype of the beam,
 a second anisotropic etching step forming a stepped surface corresponding to a depth of at least half the thickness of the beam;
 a third photolithography process of forming an insulation film over the part becoming the seismic mass;
 a fourth photolithography process of forming an etching mask over the seismic mass and the part of the wafer to become the frame; and
 a third anisotropic etching step forming the cantilever beam and a penetrating part at its periphery simultaneously.

20. A method of manufacturing an accelerometer wherein a wafer is processed in an etching process and a structure having a cantilever beam with one end attached to the inside of a frame and the other end having a seismic mass is produced,
 characterized in that the wafer is processed according to a plurality of anisotropic etching steps to produce a curvature on the end of said cantilever beam that is fixed to said frame, and
 wherein the etchant to be used in the plurality of anisotropic etching steps is an aqueous solution including any of potassium hydroxide, ammonium hydroxide, ethylenediamine and hydrazine.

* * * * *